(12) United States Patent
Lee et al.

(10) Patent No.: US 9,656,291 B2
(45) Date of Patent: May 23, 2017

(54) METHOD OF MANUFACTURING A METAL MASK

(71) Applicant: Samsung Display Co., Ltd., Yongin (KR)

(72) Inventors: Choong Ho Lee, Gunpo-si (KR); Tong-Jin Park, Suwon-si (KR); Doh-Hyoung Lee, Guri-si (KR); Sung Sik Yun, Suwon-si (KR); Da Hee Jeong, Seoul (KR); Jun Ho Jo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/477,427

(22) Filed: Sep. 4, 2014

(65) Prior Publication Data
US 2015/0068455 A1    Mar. 12, 2015

(30) Foreign Application Priority Data
Sep. 10, 2013  (KR) .................. 10-2013-0108591

(51) Int. Cl.
| | | |
|---|---|---|
| *B05C 21/00* | (2006.01) | |
| *B23K 26/382* | (2014.01) | |
| *C23C 14/04* | (2006.01) | |
| *B23K 26/082* | (2014.01) | |
| *B23K 26/0622* | (2014.01) | |
| *B23K 103/02* | (2006.01) | |

(52) U.S. Cl.
CPC ........ *B05C 21/005* (2013.01); *B23K 26/0624* (2015.10); *B23K 26/082* (2015.10); *B23K 26/382* (2015.10); *C23C 14/042* (2013.01); *B23K 2203/02* (2013.01)

(58) Field of Classification Search
CPC .. B05C 21/005; B23K 26/382; B23K 26/082; B23K 26/0624; C23C 14/042
See application file for complete search history.

(56) References Cited

U.S. PATENT DOCUMENTS

| | | | | |
|---|---|---|---|---|
| 2002/0111035 | A1* | 8/2002 | Atobe | C23C 14/042 |
| | | | | 438/753 |
| 2003/0202768 | A1* | 10/2003 | Nasiri | G02B 6/3664 |
| | | | | 385/137 |
| 2003/0217995 | A1* | 11/2003 | Toyofuku | B23K 26/0608 |
| | | | | 219/121.71 |

(Continued)

FOREIGN PATENT DOCUMENTS

| | | | |
|---|---|---|---|
| JP | 2007-296580 A | * | 11/2007 |
| JP | 2009-68082 A | * | 4/2009 |

(Continued)

OTHER PUBLICATIONS

Machine translation of Japan Patent No. 2007-296,580, Nov. 2015.*

(Continued)

*Primary Examiner* — Geoffrey S Evans
(74) *Attorney, Agent, or Firm* — H.C. Park & Associates, PLC

(57) ABSTRACT

Disclosed is a method of manufacturing a metal mask. A method of manufacturing a metal mask in accordance with an exemplary embodiment of the present invention includes forming through holes in a plate using a laser, by scanning the laser onto sequentially smaller overlapping portions of the plate.

8 Claims, 9 Drawing Sheets

(56) References Cited

U.S. PATENT DOCUMENTS

| | | | | |
|---|---|---|---|---|
| 2011/0183271 A1* | 7/2011 | Lee | ................ | B23K 26/38 |
| | | | | 430/323 |
| 2012/0211478 A1* | 8/2012 | Massa | ................ | B23K 26/0869 |
| | | | | 219/121.69 |
| 2013/0137334 A1* | 5/2013 | Ishikawa | ................ | C23C 16/042 |
| | | | | 445/58 |
| 2013/0248503 A1* | 9/2013 | Lee | ................ | B23K 31/02 |
| | | | | 219/121.72 |
| 2014/0238963 A1* | 8/2014 | Jo | ................ | B23K 26/127 |
| | | | | 219/121.77 |
| 2014/0356769 A1* | 12/2014 | Prushinskiy | ................ | B05C 21/005 |
| | | | | 430/5 |
| 2016/0005942 A1* | 1/2016 | Ukawa | ................ | H01L 33/58 |
| | | | | 438/27 |

FOREIGN PATENT DOCUMENTS

| | | | |
|---|---|---|---|
| JP | 2012-77328 A | * | 4/2012 |
| KR | 100611075 | | 8/2006 |
| KR | 1020100072642 | | 7/2010 |
| KR | 101023396 | | 3/2011 |
| WO | WO-2013/166951 A1 | * | 11/2013 |

OTHER PUBLICATIONS

Machine translation of Japan Patent No. 2009-68,082, Nov. 2015.*
Machine translation of Japan Patent No. 2012-77,328, Nov. 2015.*
Machine translation of WO 2013/166,951, Apr. 2016.*

* cited by examiner

METHOD OF MANUFACTURING A METAL MASK

CROSS-REFERENCE TO RELATED APPLICATION

This application claims priority to and the benefit of Korean Patent Application No. 10-2013-0108591, filed on Sep. 10, 2013, which is hereby incorporated by reference for all purposes as if fully set forth herein.

BACKGROUND

Field

The present disclosure relates to a method of manufacturing a metal mask and a metal mask formed thereby.

Discussion of the Background

An organic light emitting diode (OLED) display is a type of image display device is that has recently been in the spotlight. An OLED display has a self-light emitting characteristic and may have a small thickness and weight, because it does not need an additional light source like a liquid crystal display (LCD). Furthermore, an OLED display has low power consumption, a high luminance, and a high response speed.

When fabricating such an OLED display, a metal mask may be used to deposit red R, green G, and blue B organic emission layers on a substrate of the display. After forming organic light-emitting materials of one color using the metal mask, in which openings having the size of one pixel have been formed, organic light-emitting materials of other colors may be formed by moving the metal mask by one pixel cell.

In general, when fabricating a metal mask, an opening for depositing the organic light-emitting materials is formed using an etching method. As the size and/or resolution of an OLED display is increased, the size of a metal mask and the precision of openings formed in the metal mask, are limited when the metal mask is fabricated using an etching method.

SUMMARY

Aspects of the present invention provide a method of manufacturing a metal mask, which can be applied to a process of depositing light-emitting materials for a large-sized and high-resolution display device, and a metal mask formed using the method.

Additional features of the invention will be set forth in the description which follows, and in part will be apparent from the description, or may be learned by practice of the invention.

An exemplary embodiment of the present invention provides a method of manufacturing a metal mask, including planarizing a plate; and forming through holes in the planarized plate by scanning a laser multiple times onto corresponding pattern regions of the plate, wherein the second step includes penetrating the thin plate while forming grooves gradationally by irradiating the laser to pattern regions of the thin plate.

Another exemplary embodiment of the present invention provides a metal mask manufactured using the method of manufacturing a metal mask, wherein the through holes are rectangular and are arranged in a matrix.

In accordance with an exemplary embodiment of the present invention, a method of manufacturing a metal mask which can form an accurate pattern using an ultra-short pulsed laser, and a metal mask using the same are provided. It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE EMBODIMENTS

Figure 1:
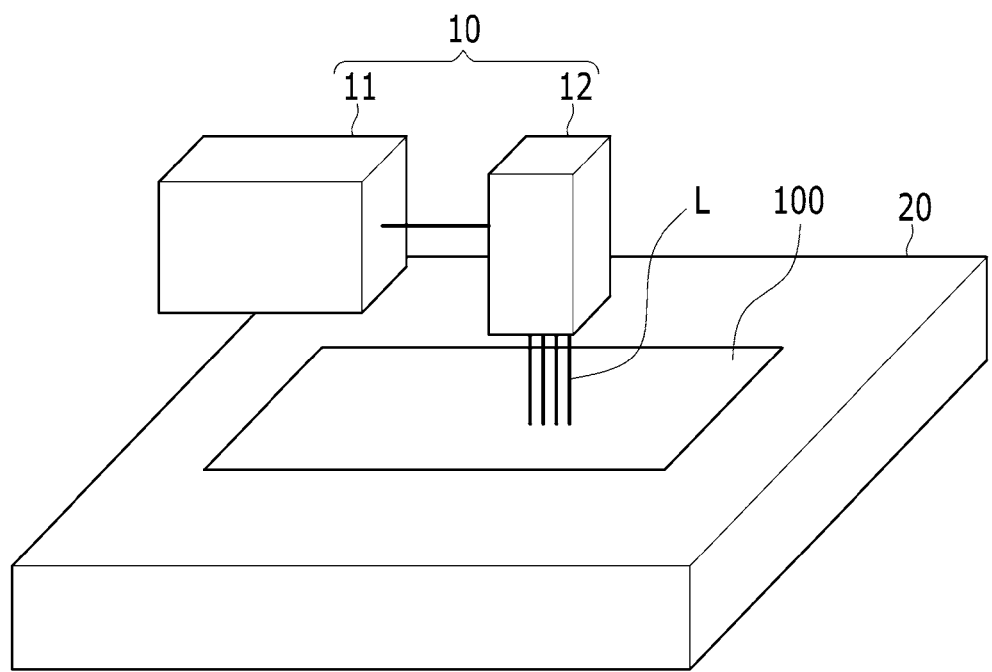
FIG. 1 schematically shows the fabrication of a metal mask in accordance with an exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed asXonly, Y only, Z only, or any combination of two or more items X, Y, and Z (e.g., XYZ, XYY, YZ, ZZ).

FIG. 1 schematically shows a metal mask 100 being fabricated, in accordance with an exemplary embodiment of the present invention. Referring to FIG. 1, the metal mask 100 may be mounted on a stage 20 and fabricated using a laser L.

A laser irradiation apparatus 10 may be installed in the stage 20. The laser irradiation apparatus 10 may include a generation unit 11 configured to generate the laser L, and a transfer unit 12 configured to transfer the laser L with respect to the metal mask 100.

The laser L may be an ultra-short pulsed laser emitting at a very short wavelength. For example, the laser L may be a pico-second laser or a femto-second laser. Accordingly, very accurate pattern processing can be performed using the laser L, which is described later in detail below.

Although not shown in FIG. 1, the stage 20 may be equipped with fixing device for fixing the metal mask 100. Furthermore, the laser irradiation apparatus 10 may be connected to an additional moving unit configured to move the laser irradiation apparatus 10 with respect to the stage 20 and that is installed on the stage 20.

As shown in FIG. 1, various embodiments may be performed so as to fix a thin plate, that is, a material for the metal mask 100, to the stage 20 in a flat state, and to form a pattern by radiating the laser L onto the flat thin plate.

Figure 2:
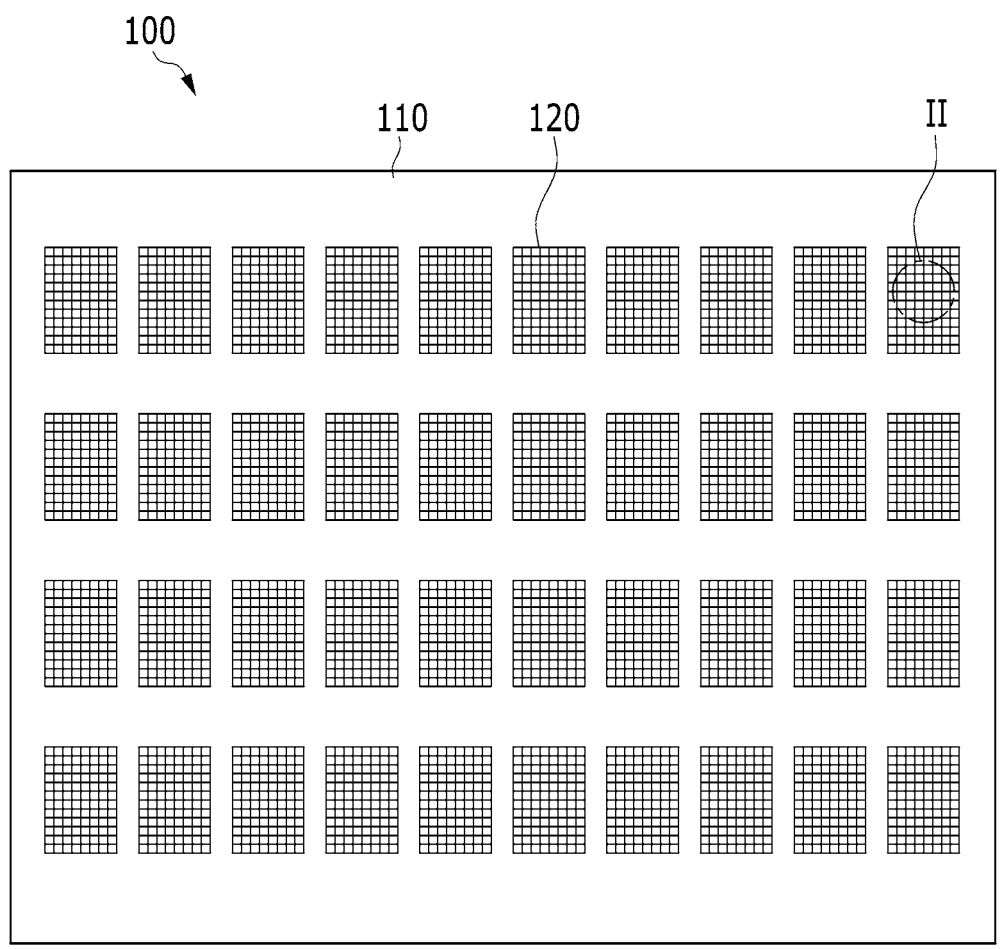
FIG. 2 is a top plan view of the metal mask, in accordance with an exemplary embodiment of the present invention.
Figure 3:
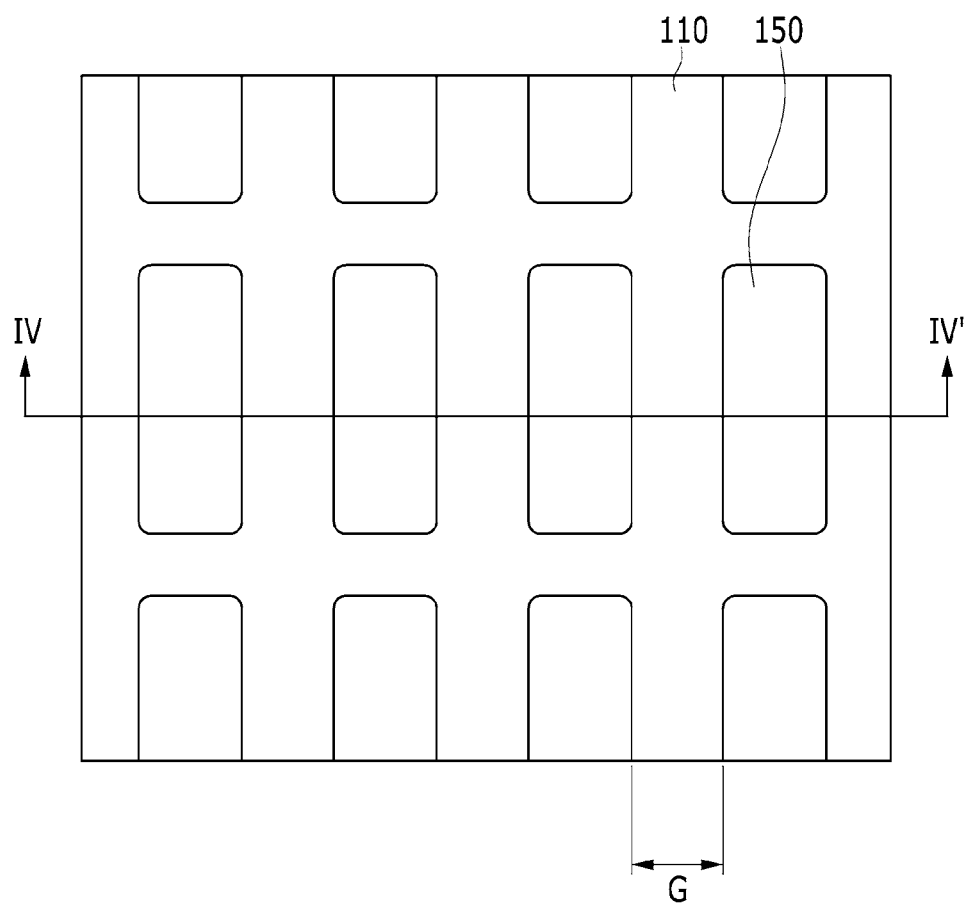
FIG. 3 is an enlarged view of a portion II in FIG. 2.
Figure 4:
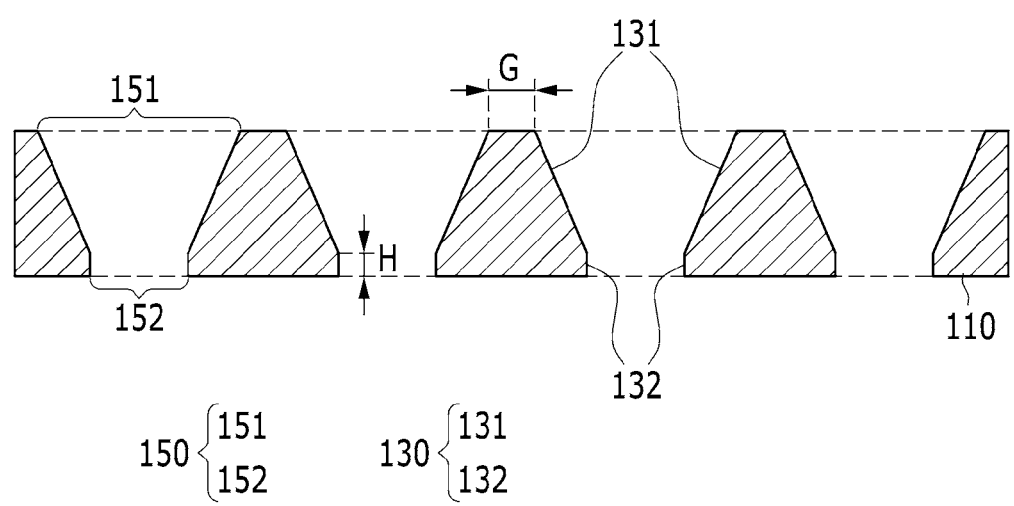
FIG. 4 is a cross-sectional view of line VI-VI' in FIG. 3.

FIG. 2 is a top plan view of the metal mask 100, in accordance with an exemplary embodiment of the present invention. FIG. 3 is an enlarged view of a portion II in FIG. 2. FIG. 4 is a cross-sectional view of line IV-IV' in FIG. 3. In this specification, a "depth" and a "vertical direction" are defined as up and down directions on the basis of FIG. 4.

The metal mask 100 may be used in a process of depositing light-emitting materials on a substrate of a display device. In accordance with an exemplary embodiment of the present invention, the metal mask 100 may be used to deposit organic light-emitting materials on a substrate of an OLED display. More particularly, the organic light-emitting materials may be deposited on the substrate in a pattern corresponding to openings that are formed in the metal mask 100.

Referring to FIG. 2, a plurality of deposition parts 120 may be arranged in matrix on a thin plate 110 of the metal mask 100. In accordance with an exemplary embodiment of the present invention, the thin plate 110 may be made of an Invar alloy. The Invar alloy is an alloy formed of 64% Fe and 36% Ni, and has a very low coefficient of thermal expansion. In accordance with an exemplary embodiment of the present invention, the thickness of the thin plate 110 may be 10 μm to 100 μm.

Through holes can be accurately formed even in a thin plate having a thickness of about 10 μm, because the thin plate 110 is processed using an ultra-short pulsed laser, as described above. Since a processing depth formed when using an ultra-short pulsed laser is used is about 1 μm to 4 μm, the thickness of the thin plate 110 is generally 100 μm or less, for processing efficiency. Herein, the processing depth refers to an amount of material removed by one or more pulses of the laser. The deposition parts 120 may be configured to deposit organic light-emitting materials on a substrate of an OLED display.

Referring to FIGS. 3 and 4, the deposition part 120 may include a plurality of through holes 150 each having a size corresponding to a pixel cell region of an OLED display. Each through hole 150 should be configured to permit the passage of organic light-emitting materials. The through holes 150 have been illustrated to have a rectangular shape in FIG. 3, but the present invention is not limited thereto. The through holes 150 may have various shapes, so that organic light-emitting materials are effectively deposited.

The through holes 150 may be arranged in a matrix at a constant interval. An interval G between the through holes 150 (refer to FIGS. 3 and 4) may be 5 μm to 50 μm. When the through holes 150 are arranged at intervals of about 5 μm, the through holes 150 can be formed on the thin plate 110 using an ultra-short pulsed laser, as described above.

As the interval G between the through holes 150 is reduced, organic light-emitting materials can be deposited more accurately, and the resolution of the organic light-emitting materials can be increased. If the interval G between the through holes 150 is too small, however, the structure of the metal mask 100 may become weak, which may make it difficult to handle a completed metal mask 100. For this reason, the interval G between the through holes 150 is generally 50 μm or less.

As shown in the cross-section of FIG. 4, the through holes 150 may include first openings 151 formed in an upper (first) surface of the thin plate 110 and second openings 152 formed in a lower (second) surface of the thin plate 110. The first openings 151 may be wider than the second openings 152. In other words, the through holes 150 have a tapered cross-section, wherein an opening disposed far from a substrate on which organic light-emitting materials will be deposited may have a wider cross-section than an opening disposed close to the substrate. In this case, in a process of depositing organic light-emitting materials through the through holes 150, a deposition film can be prevented from being irregularly formed, due to a limited incident angle.

More particularly, referring to FIG. 4, the upper opening 151 may have a wider cross-section than the lower opening 152, on the basis of the cross-section of the thin plate 110. A substrate on which organic light-emitting materials can be deposited may be disposed under the thin plate 110. The through holes 150 are formed to penetrate the thin plate 110. In a process of forming the through holes 150, inside surfaces 130 of the through holes 150 are formed.

Referring to FIG. 4, the inside surfaces 130 of each of the through holes 150 may include a sloped portion 131 and a bottom portion 132. Sidewalls of the sloped portion 131 are inclined due to a difference between the widths of the first opening 151 and the second opening 152. In accordance with an exemplary embodiment of the present invention, the sidewalls of the sloped portion 131 may have a constant slope. Accordingly, the sloped portion 131 is illustrated as being a straight line on the basis of the cross-section of the thin plate 110, as shown in FIG. 4.

The bottom portion 132 extends from the second opening 152. In accordance with an exemplary embodiment of the present invention, the bottom portion 132 can have substantially vertical sidewalls that extend from the sidewalls of the sloped portion 131. Accordingly, the inside surface 130 of the through hole 150 can include the sloped portion 131 that extends from the first opening 151 to the bottom portion 132, and the bottom portion 132 can extend to the second opening 152. The length H of the bottom portion 132 in the vertical direction can be 2 μm, or less.

If the length H of the bottom portion 132 is reduced in the vertical direction as described above, irregularities in a deposition film may be reduced, due to a limited incident angle of organic light-emitting materials in a process of depositing the organic light-emitting materials. The characteristics of the metal mask 100 are described in brief below, with reference to the drawing of a metal mask fabricated using a conventional method, so that the characteristics of the metal mask 100 can be compared with those of the conventional metal mask.

Figure 9:
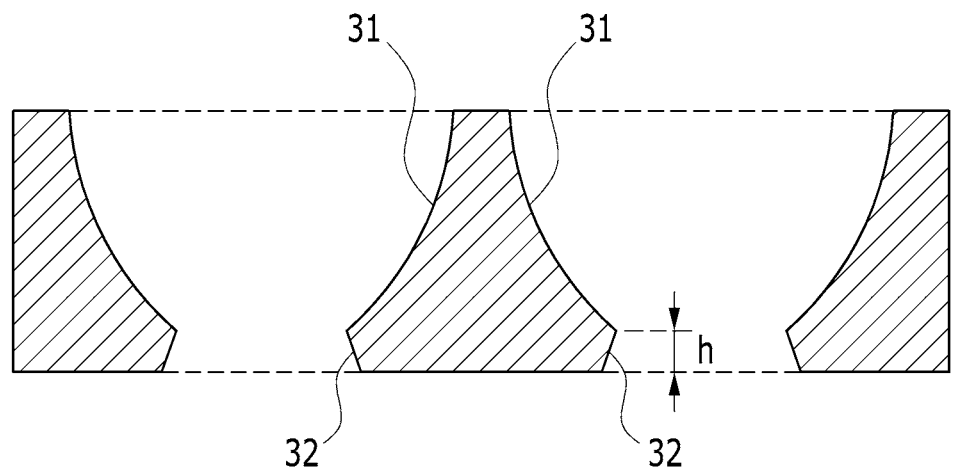
FIG. 9 is a cross-sectional view of a metal mask fabricated using a conventional method.

FIG. 9 is a cross-sectional view of a metal mask fabricated using a conventional method. FIG. 9 shows the cross-section of the conventional metal mask in a thickness direction. The metal mask includes through holes formed in a thin plate. In the related art, the through holes are formed in the thin plate using an etching method.

Referring to FIG. 9, the cross-section of an opening at the upper part of the through hole is different from that of an opening at the lower part of the through hole. Thus, a sloped portion 31 can be formed on the inside surface of the through hole. Furthermore, the sloped portion 31 can be connected to the smaller opening through a bottom portion 32.

In general, when forming the patterns of a metal mask, a wet etching method for etching parts that need to be removed, by selectively dissolving the parts using soluble chemical materials, is used. The inside surface of the pattern has a concave shape, because the wet etching method is isotropic. Accordingly, the sloped portion 31 has a variable slope rather than a continuous slope, and the bottom portion 32 is also sloped rather than vertical, as shown in FIG. 9.

The length "h" of the bottom portion 32 in the vertical direction is 4 μm or more, due to the limitations of the etching method. A difference in the shape between the cross-section of the conventional metal mask and the cross-section of the metal mask 100 can be determined.

The metal mask fabricated using a conventional method, that is, the etching method, is problematic, in that an incident angle limits a process of depositing organic light-emitting materials. Accordingly, the conventional metal mask is problematic in that the precision of pattern processing is low, and it is difficult to uniformly form a deposition film, as compared with using the metal mask 100.

Furthermore, the metal mask fabricated using the conventional etching method has a limit with respect to the fabrication of a display device having a large size and high resolution, due to size limitations of the through holes and a reduction in through hole location precision. In contrast, a metal mask fabricated using a laser can solve the problems of the conventional metal mask, and a method of manufacturing a metal mask in accordance with an exemplary embodiment of the present invention is described in detail below.

Figure 5:
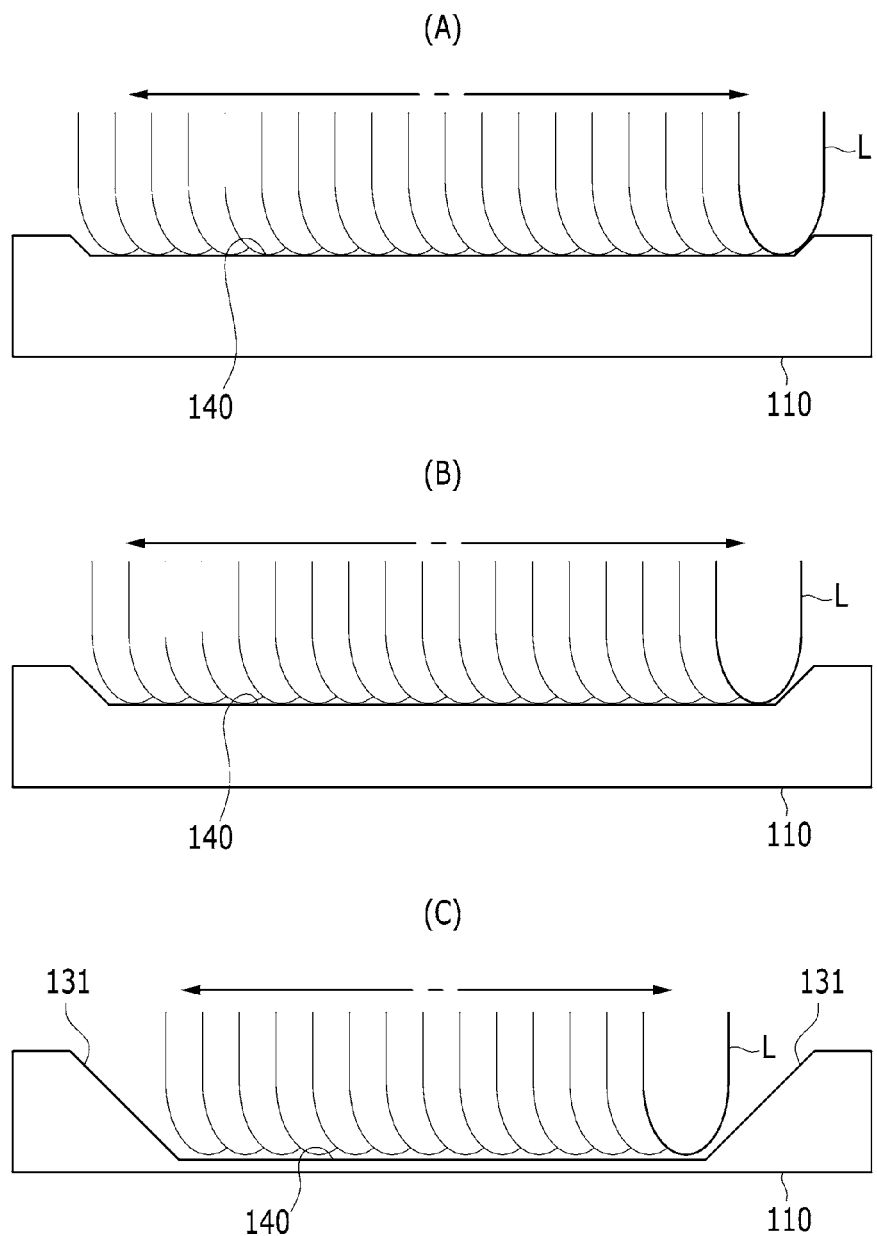
FIGS. 5A-5C are a cross-sectional views illustrating a groove formation operation of a method of manufacturing a metal mask, in accordance with an exemplary embodiment of the present invention.
Figure 6:
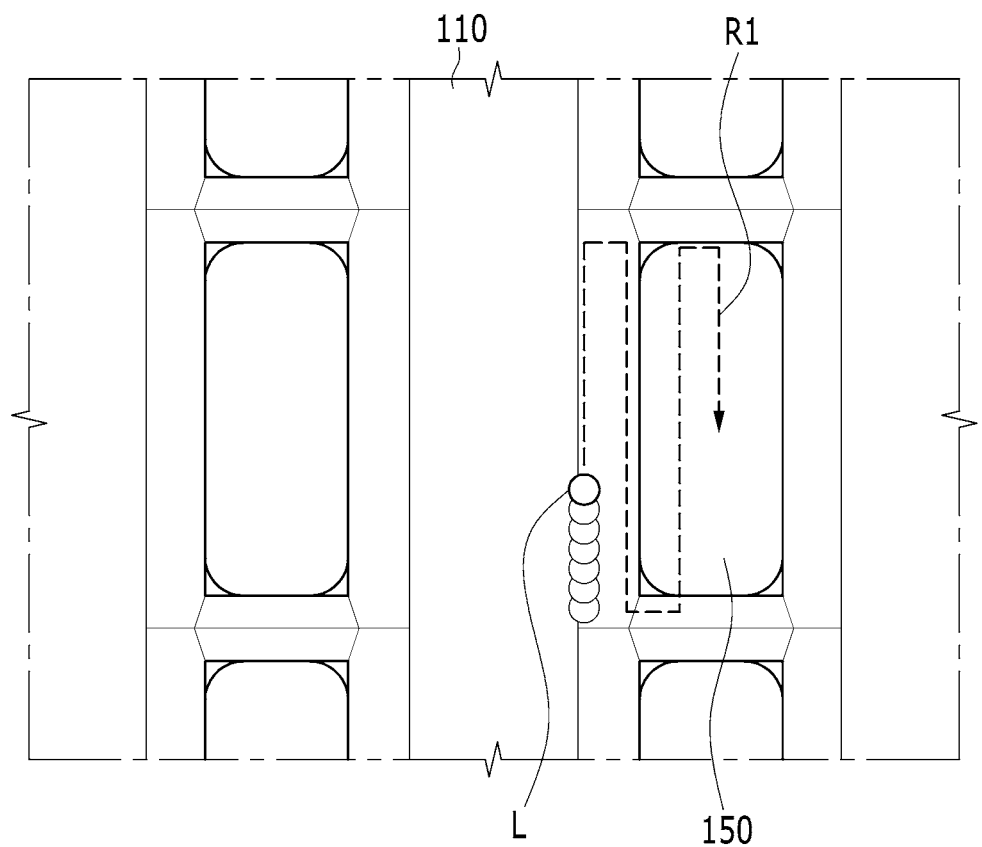
FIG. 6 is a top plan view illustrating the groove formation operation of the method of manufacturing a metal mask in accordance with an exemplary embodiment of the present invention.
Figure 7:
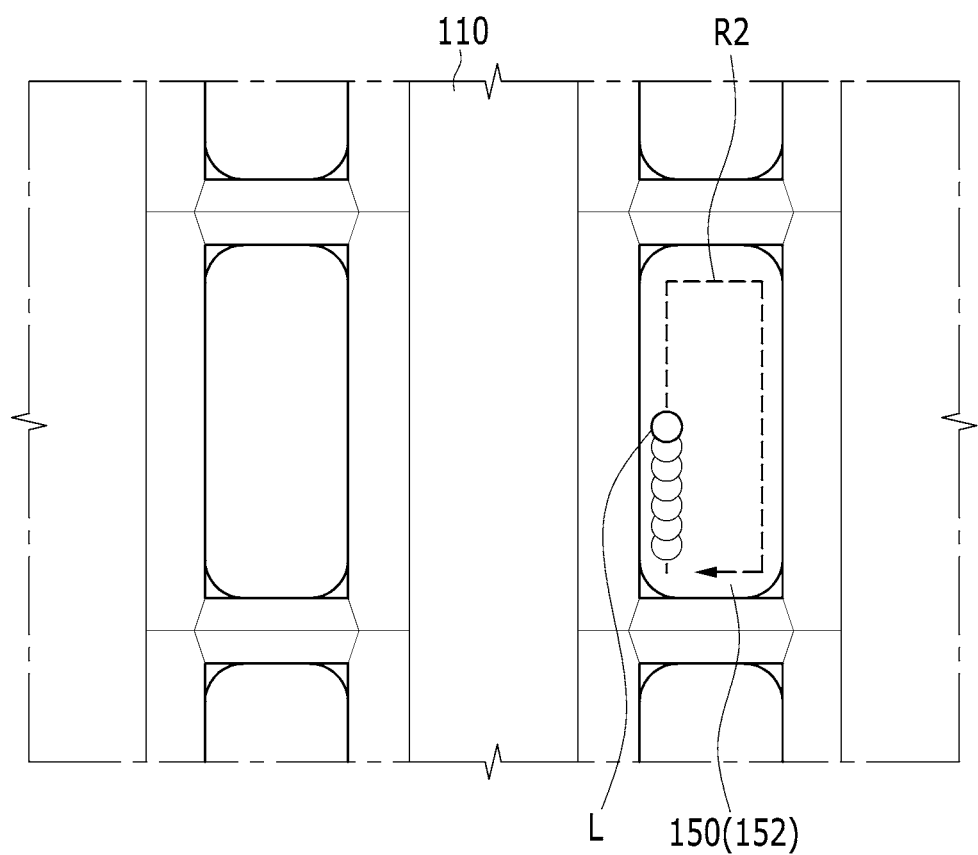
FIG. 7 is a cross-sectional view illustrating an opening formation operation of the method of manufacturing a metal mask, in accordance with an exemplary embodiment of the present invention.
Figure 8:
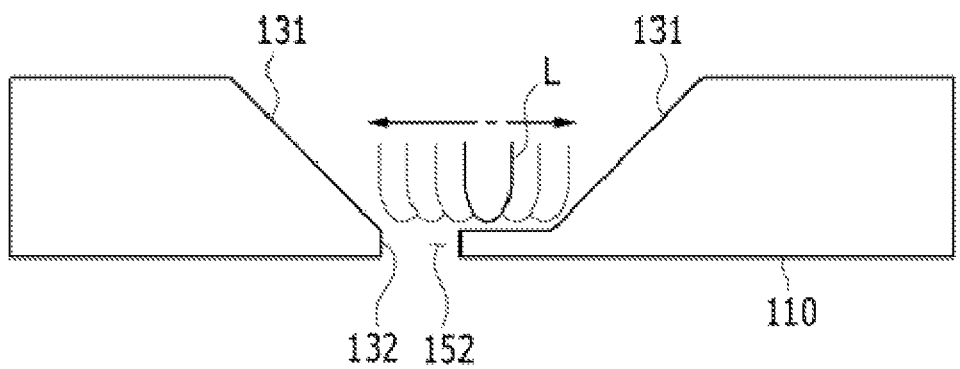
FIG. 8 is a top plan view illustrating the opening formation operation of the method of manufacturing a metal mask, in accordance with an exemplary embodiment of the present invention.

FIG. 5 (A) shows the state in which a first scan of the laser L is performed for forming the groove 140, FIG. 5 (B) shows a state in a subsequent scan for forming the groove 140 is performed, and FIG. 5 (C) shows the state in which a scan is performed right before the thin plate 110 is penetrated. FIG. 6 is a top plan view illustrating the groove formation operation. FIG. 7 is a cross-sectional view illustrating an opening formation operation of the method of manufacturing a metal mask, in accordance with an exemplary embodiment of the present invention. FIG. 8 is a top plan view illustrating the opening formation operation of the method.

The method of manufacturing a metal mask may include a first operation of evenly disposing the thin plate 110 and a second operation of forming the through holes 150 in the thin plate 110. In the first operation, the through holes 150 are ready to be formed in the thin plate 110. In accordance with an exemplary embodiment of the present invention, the first operation may include a planarization operation of making the thin plate 110 in a flat shape, and a mounting operation of mounting the thin plate 110 on the stage 20 equipped with the laser irradiation apparatus 10. More particularly, since the thin plate 110 made of an Invar material is initially supplied in a roll form, the planarization operation is performed in order to make the thin plate 110 have a flat shape.

A process of cutting the thin plate 110 into appropriate sizes may be included in the planarization operation. The thin plate 110 can be made flat using a jig employing an electromagnetic force.

The mounting operation is performed in order to mount the thin plate 110 on the stage 20. The thin plate 110 may be mounted on the stage 20 in a horizontal state. The stage 20 may include a fixing device for fixing the thin plate 110, so that the thin plate 110 is not moved when processing the patterns 150, for example, a vacuum chuck. The stage 20 may further include an additional driving device configured to move the stage 20.

The stage 20 may be equipped with the laser irradiation apparatus 10 configured to radiate a laser to the thin plate 110 mounted on the stage 20. In this case, the laser irradiation apparatus 10 may be disposed over the stage 20. The second operation of forming the through holes 150 in the thin plate 110 is performed after the thin plate 110 is secured to the stage 20.

In the second operation, the through holes 150 can be formed in the thin plate 110 using a laser. In this case, the through holes 150 can be formed in the pattern region of the thin plate 110, by gradually forming a groove 140, by radiating the laser L onto the pattern region. That is, the second operation can be divided into a groove formation operation and an opening formation operation, and the groove and opening formation operations are consecutive operations.

Referring to FIG. 5, the groove 140 can be formed by gradually reducing the thickness of a portion of the thin plate 110, by irradiating overlapping portions of the thin plate 110 in a scan pattern. For example, if the laser L by which a processed depth is controlled to 2 μm per scan, in relation to the thin plate 110 having a thickness of 20 μm, the through hole 150 can be formed by radiating the laser L onto the thin plate 110 for a total of ten scans. In other words, the laser is L scanned across the thin plate 110 ten times, in order to form the through hole 150 completely through the thin plate 110.

That is, the thickness of the thin plate 110 is reduced by 2 μm each time the laser L is scanned across the thin plate 110, until the through hole 150 is completed. In other words, each scan increases the depth of the groove 140, until the thin plate 110 is completely penetrated and the through hole 150 is formed. In addition, the area over which the laser L is scanned may be reduced in subsequent scans, such that the inclined portion 131 can be formed. In other words, the laser may be scanned over sequentially smaller overlapping areas to form the sloped portion 131.

The processed depth can be controlled by controlling power of the laser L. If the number of scans used when processing the pattern 150 is increased, the time taken for the processing is increased, but processing precision can be improved. In contrast, if the number of scans is reduced by increasing the processing depth of the laser L, the time taken for the processing is reduced, but processing precision may be relatively reduced.

In accordance with an exemplary embodiment of the present invention, an area to which the laser L is scanned can be reduced in subsequent scans. Accordingly, the sloped portion 131 can be formed in the inside surface of the groove 140, as shown in FIG. 5. If the processing depth of a scan is sufficiently reduced, the sloped portion 131 can be formed to have a constant slope.

As shown in FIGS. 7 and 8, a final scan of the laser L is shown, where the laser L penetrates through the thin plate 110. For example, as described above, the through hole 150 that penetrates the thin plate 110 can be formed by radiating the laser L onto the thin plate 110 for a total of ten scans. Here, the first nine scans may be used to form the sloped portion 131, and a tenth scan may be used to form the bottom portion 132, thereby completing the through hole 150.

As shown in FIGS. 7 and 8, the last scan of the laser L forms the bottom portion 132 and the second opening 152 that is smaller than the first opening 151. Here, the length of the bottom portion 132 in the vertical direction may be 2 μm, which is the same as the processing depth of the last layer. In accordance with an exemplary embodiment of the present invention, a method of radiating the laser L in the groove formation operation and the opening formation operation can be controlled.

Referring to FIG. 6, the laser L is scanned along the path R1 of a zigzag shape (raster pattern). Furthermore, an opening can be efficiently formed by scanning the laser L along a path R2, in order to form the bottom portion 132 and the second opening 152, as shown in FIG. 8. The path R2 may correspond to the perimeter of the second opening 152.

As described above, the through holes 150 can be accurately formed in the thin plate 110 using the laser L. The processing precision of the through holes 150 can be further improved by using an ultra-short pulsed laser as described above.

For example, if a pico-second laser or a femto-second laser is used, processing using a cold ablation process is possible. More particularly, if an ultra-short pulsed laser, such a pico-second laser or a femto-second laser, is used, the surface of a processing article is not molten upon processing, but is directly evaporated in a particle form, because the ultra-short pulsed laser has a very short pulse duration and very high instant peak energy. Thus, processing is completed before heat is transferred to surrounding areas. Accordingly, processing can be performed almost without generating heat in the processing article.

Accordingly, in the method of manufacturing a metal mask in accordance with an exemplary embodiment of the present invention, the through holes 150 can be processed minutely, precisely, and effectively, using the cold ablation process, without damaging the thin plate 110, because the through holes 150 are formed using the ultra-short pulsed laser.

As described above, the method of manufacturing a metal mask in accordance with an exemplary embodiment of the present invention can be used to effectively process accurate patterns, because the ultra-short pulsed laser is used.

Accurate patterns can be formed using a method of forming a flat layer having a specific depth by scanning a laser having a constant processing depth, over an area multiple times.

The metal mask 100 includes the plurality of minute through holes 150 formed in the thin plate 110 having a large size and a thin thickness. Accordingly, the metal mask 100 can be applied to a process of depositing light-emitting materials for a large-sized and high-resolution display device, because of the precision of the through holes 150.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a metal mask, comprising:
planarizing a thin plate; and
forming through holes in the thin plate, each through hole being formed by scanning a laser multiple times onto a corresponding pattern region of the thin plate,
wherein forming the through holes comprises, for each through hole:
forming a sloped portion by scanning the laser on successively smaller overlapping portions of the corresponding pattern region;
forming an opening below the sloped portion by using the laser to cut through a remaining portion of the plate; and
the remaining portion of the plate is less than about 2 μm.

2. The method of claim 1, wherein the scanning comprises moving the laser along a path having a zigzag shape.

3. The method of claim 1, wherein the plate comprises an alloy of 36% nickel and a remainder of iron.

4. The method of claim 1, wherein the sloped portion comprises sidewalls that have a substantially constant slope.

5. The method of claim 1, wherein the forming of the opening comprises scanning the laser along only an edge of the opening.

6. The method of claim 1, further comprising mounting the planarized plate on a stage equipped with a laser generating apparatus.

7. The method of claim 1, wherein the laser is an ultra-short pulsed laser.

8. A method of manufacturing a metal mask, comprising:
planarizinq a thin plate; and
forming through holes in the thin plate, each through hole being formed by scanning a laser multiple times onto a corresponding pattern region of the thin plate,
wherein forming the through holes comprises, for each through hole:
forming a sloped portion by scanning the laser on successively smaller overlapping portions of the corresponding pattern region; and
forming an opening below the sloped portion by using the laser to cut through a remaining portion of the plate, and
wherein a thickness of the pattern region of the thin plate prior to scanning the laser is 75 μm to 100 μm.

* * * * *